(12) United States Patent
Johnson et al.

(10) Patent No.: US 10,738,224 B2
(45) Date of Patent: Aug. 11, 2020

(54) NANOCLAY FILLED BARRIER ADHESIVE COMPOSITIONS

(71) Applicant: 3M INNOVATIVE PROPERTIES COMPANY, St. Paul, MN (US)

(72) Inventors: Jacob P. Johnson, St. Paul, MN (US); Fred B. McCormick, Maplewood, MN (US); Adam J. Meuler, Woodbury, MN (US); Richard J. Pokorny, Maplewood, MN (US); Daniel J. Schmidt, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 139 days.

(21) Appl. No.: 15/753,222

(22) PCT Filed: Aug. 15, 2016

(86) PCT No.: PCT/US2016/047082
§ 371 (c)(1),
(2) Date: Feb. 16, 2018

(87) PCT Pub. No.: WO2017/031074
PCT Pub. Date: Feb. 23, 2017

(65) Prior Publication Data
US 2018/0237665 A1 Aug. 23, 2018

Related U.S. Application Data

(60) Provisional application No. 62/206,044, filed on Aug. 17, 2015.

(51) Int. Cl.
| | | |
|---|---|---|
| *B32B 27/36* | (2006.01) | |
| *B32B 7/12* | (2006.01) | |
| *B32B 27/34* | (2006.01) | |
| *B32B 27/28* | (2006.01) | |
| *B32B 27/20* | (2006.01) | |
| *B32B 27/08* | (2006.01) | |
| *B32B 27/32* | (2006.01) | |
| *C09J 123/22* | (2006.01) | |
| *C09J 7/38* | (2018.01) | |
| *C09J 7/22* | (2018.01) | |
| *C09J 11/04* | (2006.01) | |
| *C08K 5/19* | (2006.01) | |
| *C08K 9/06* | (2006.01) | |
| *C08K 9/04* | (2006.01) | |
| *C08L 23/22* | (2006.01) | |
| *C08K 3/34* | (2006.01) | |
| *H01L 51/52* | (2006.01) | |

(52) U.S. Cl.
CPC .............. *C09J 123/22* (2013.01); *B32B 7/12* (2013.01); *B32B 27/08* (2013.01); *B32B 27/20* (2013.01); *B32B 27/28* (2013.01); *B32B 27/32* (2013.01); *B32B 27/34* (2013.01); *C08K 3/346* (2013.01); *C08K 5/19* (2013.01); *C08K 9/06* (2013.01); *C08L 23/22* (2013.01); *C09J 7/22* (2018.01); *C09J 7/38* (2018.01); *B32B 2264/10* (2013.01); *B32B 2307/724* (2013.01); *B32B 2307/7244* (2013.01); *C08F 2500/01* (2013.01); *C08K 9/04* (2013.01); *C08K 2201/005* (2013.01); *C09J 2203/318* (2013.01); *C09J 2205/102* (2013.01); *C09J 2423/00* (2013.01); *C09J 2423/001* (2013.01); *C09J 2467/006* (2013.01); *H01L 51/5246* (2013.01)

(58) Field of Classification Search
None
See application file for complete search history.

(56) References Cited

U.S. PATENT DOCUMENTS

| | | |
|---|---|---|
| 4,696,719 A | 9/1987 | Bischoff |
| 4,722,515 A | 2/1988 | Ham |
| 4,842,893 A | 6/1989 | Yializis |
| 4,954,371 A | 9/1990 | Yializis |
| 5,018,048 A | 5/1991 | Shaw |
| 5,032,461 A | 7/1991 | Shaw |
| 5,097,800 A | 3/1992 | Shaw |
| 5,125,138 A | 6/1992 | Shaw |
| 5,440,446 A | 8/1995 | Shaw |
| 5,547,908 A | 8/1996 | Furuzawa |
| 5,916,685 A | 6/1999 | Frisk |
| 6,045,864 A | 4/2000 | Lyons |
| 6,214,422 B1 | 4/2001 | Yializis |

(Continued)

FOREIGN PATENT DOCUMENTS

| | | |
|---|---|---|
| JP | 2012-193335 | 10/2012 |
| WO | WO 2000-026973 | 5/2000 |

(Continued)

OTHER PUBLICATIONS

Affinito, "Polymer-Oxide Transparent Barrier Layers", Society of Vacuum Coaters, 39th Annual Technical Conference Proceedings, 1996, pp. 392-397.
Affinito, "Vacuum Deposited Polymer/Metal Multilayer Films for Optical Application", Thin Solid Films, 1995, vol. 270, pp. 43-48.
Roehrig, "Use of Evaporated Acrylate Coatings to Smooth the Surface of Polyester and Polypropylene Film Substrates", Journal of Plastic Film & Sheeting, Jul. 1997, vol. 13, pp. 235-251.

(Continued)

*Primary Examiner* — Sheeba Ahmed
(74) *Attorney, Agent, or Firm* — Lisa P. Fulton

(57) ABSTRACT

A barrier adhesive composition comprising a resin system and organically modified nanoclay. The resin system comprises (a) a first polyisobutylene resin having a viscosity average molecular weight of about 300,000 to about 500,000 g/mol, (b) a second polyisobutylene resin having a viscosity average molecular of about 700,000 to about 900,000 g/mol and (c) tackifier.

22 Claims, 5 Drawing Sheets

(56) References Cited

U.S. PATENT DOCUMENTS

| | | | |
|---|---|---|---|
| 6,231,939 | B1 | 5/2001 | Shaw |
| 7,940,004 | B2 | 5/2011 | Padiyath |
| 8,232,350 | B2 | 7/2012 | Fujita |
| 8,697,789 | B2 | 4/2014 | Joly |
| 8,808,731 | B2 | 8/2014 | Iwao |
| 2007/0160781 | A1 | 7/2007 | Landon |
| 2007/0179236 | A1 | 8/2007 | Landon |
| 2009/0026934 | A1 | 1/2009 | Fujita |
| 2010/0089636 | A1 | 4/2010 | Ramadas |
| 2014/0377554 | A1* | 12/2014 | Cho .......................... C09J 7/20 428/355 EN |
| 2015/0056757 | A1 | 2/2015 | Liu |

FOREIGN PATENT DOCUMENTS

| | | |
|---|---|---|
| WO | WO 2016-069674 | 5/2016 |
| WO | WO 2017-031031 | 2/2017 |

OTHER PUBLICATIONS

Shaw, "A New High-Speed Process for Vapor Depositing Acrylate Thin Films: An Update", Society of Vacuum Coaters, 36th Annual Technical Conference Proceedings, 1993, pp. 348-351.

Shaw, "A New Vapor Deposition Process for Coating Paper and Polymer Webs", Technical Paper Presented at 6th International Vacuum Coating Conference, Oct. 1992, pp. 18-24.

Shaw, "Use of Evaporated Acrylate Coatings to Smooth the Surface of Polyester and Polypropylene Film and Aluminum Foil Substrates", RadTech '96 North America UV/EB Conference Proceedings, vol. II, Apr. 1996, pp. 701-707.

Shaw, "Use of Vapor Deposited Acrylate Coatings to Improve the Barrier Properties of Metallized Film", Society of Vacuum Coaters, 37th Annual Technical Conference Proceedings, 1994, pp. 240-247.

International Search Report for PCT International Application No. PCT/US2016/047082, dated Nov. 22, 2016, 5 pages.

\* cited by examiner

NANOCLAY FILLED BARRIER ADHESIVE COMPOSITIONS

FIELD

This invention relates to nanoclay filled barrier adhesive compositions to adhesive barrier films comprising a layer of said adhesives.

BACKGROUND

Organic electronic devices require protection from moisture and oxygen in order to provide adequately long lifetimes for commercial applications. An encapsulant is therefore utilized to protect the device from contact with moisture and oxygen. Glass is one commonly used encapsulant, but glass significantly impairs the flexibility of the device. It can therefore be desirable to replace glass with flexible barrier films. Flexible barrier films can enable flexible devices as well as lighter, thinner, more rugged rigid devices.

Flexible barrier films have been commercialized for general use in organic electronic devices. A flexible barrier film is typically laminated to the device it will protect using an adhesive. It is therefore important that the adhesive also have good barrier properties to minimize moisture and oxygen bond line edge ingress. Some barrier adhesives such as those described, for example, in U.S. Patent Application Pub. No. US 2014/0377554 (Cho et al.) include nanoclays as a "moisture blocker".

SUMMARY

In view of the foregoing, we recognize that for particularly demanding organic electronic device applications such as, for example, long lifetime organic light emitting diode (OLED) displays, improved barrier adhesives are needed.

Briefly, in one aspect, the present invention provides barrier adhesive compositions comprising a resin system and organically modified nanoclay. The resin system comprises (a) a first polyisobutylene resin having a viscosity average molecular weight of about 300,000 to about 500,000 g/mol, (b) a second polyisobutylene resin having a viscosity average molecular of about 700,000 to about 900,000 g/mol and (c) tackifier.

In another aspect, the present invention provides barrier adhesive compositions comprising a resin system, organically modified nanoclay, and solvent. The resin system comprises (a) about 15 to about 35 wt. % of a first polyisobutylene resin having a viscosity average molecular weight of about 300,000 to about 500,000 g/mol, (b) about 40 to about 60 wt. % of a second polyisobutylene resin having a viscosity average molecular of about 700,000 to about 900,000 g/mol, and (c) about 15 to about 35 wt. % of tackifier, all relative to the total weight of the resin system.

In yet another aspect, the present invention provides adhesive barrier films comprising a layer of the barrier adhesive composition of the invention disposed on a gas-barrier film as well as barrier adhesive articles comprising a layer of the barrier adhesive composition of the invention disposed between release layers.

When the barrier adhesive compositions of the invention are applied to an ultra-barrier film, the coated ultra-barrier film construction has substantially improved barrier performance. As used herein, the term "ultra-barrier film" means a film having an oxygen transmission rate less than about 0.005 cc/m$^2$/day at 23° C. and 90% RH and a water vapor transmission rate of less than about 0.005 g/m2/day at 23° C. and 90% RH.

Surprisingly, however, the nanoclay-filled barrier adhesive does not, by itself, perform significantly better than an unfilled control adhesive. Similarly, there is no significant improvement in the barrier performance of a lower grade barrier film (for example, a food grade barrier film) when it is coated with the nanoclay-filled barrier adhesive of invention than when it is coated with an unfilled control adhesive.

DETAILED DESCRIPTION

Figure 1:
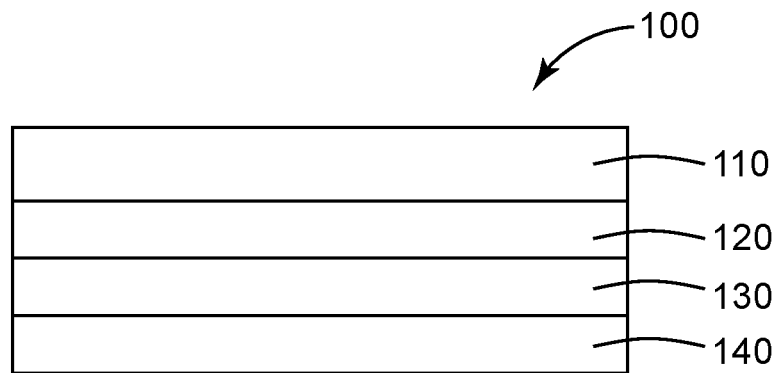
FIG. 1 is a schematic representation of a barrier film construction.

The barrier adhesive compositions of the invention comprise a resin system comprising polyisobutylene resin. The polyisobutylene resin has a viscosity average molecular weight of about 300,000 to about 900,000 g/mol. In some embodiments, the resin system comprises a blend of a first polyisobutylene resin having a viscosity average molecular weight of about 300,000 to about 500,000 g/mol, about 350,000 to about 450,000 g/mol, or about 400,000 g/mol and (b) a second polyisobutylene resin has a viscosity average molecular weight of about 700,000 to about 900,000 g/mol, about 650,000 g/mol to about 850,000 g/mol, or about 800,000 g/mol.

In some embodiments, the resin system comprises about 65 to about 85 wt. % of polyisobutylene resin relative to the total weight of the resin system. In some embodiments, the resin system comprises about 15 to about 35 wt. %, about 20 to about 30 wt. %, or about 25 wt. %, of the first polyisobutylene resin relative to the total weight of the resin system. In some embodiments, the resin system comprises about 40 to about 60 wt. %, about 45 to about 55 wt. %, or about 50 wt. %, of the second polyisobutylene resin relative to the total weight of the resin system.

The polyisobutylene resins are generally resins having a polyisobutylene resin skeleton in the main or a side chain. In some embodiments, the polyisobutylene resins are substantially homopolymers of isobutylene such as, for example, polyisobutylene resins available under the tradenames of OPPANOL (BASF AG) and GLISSO-PAL (BASF AG). Examples of suitable commercially available polyisobutylene resins include OPPANOL B50 (Mv=400,000) and OPPANOL B80 (Mv=800,000). In some embodiments, the polyisobutylene resins comprise copolymers of isobutylene such as, for example, synthetic rubbers wherein isobutylene is copolymerized with another monomer. Synthetic rubbers include butyl rubbers which are copolymers of mostly isobutylene with a small amount of isoprene such as, for example, butyl rubbers available under the tradenames VISTANEX (Exxon Chemical Co.) and JSR BUTYL (Japan Butyl Co., Ltd.). Synthetic rubbers also include copolymers of mostly isobutylene with styrene, n-butene or butadiene. In some embodiments, a mixture of isobutylene homopolymer and butyl rubber may be used. For example, the first polyisobutylene resin can comprise a homopolymer of isobutylene and the second polyisobutylene can comprise butyl rubber, or the first polyisobutylene can comprise butyl rubber and the second polyisobutylene can comprise a homopolymer of isobutylene. The first and second polyisobutylene resins may each comprise more than one resin.

The polyisobutylene resins generally have a solubility parameter (SP value), which is an index for characterizing the polarity of a compound, that is similar to that of hydrogenated cycloaliphatic hydrocarbon resins, and exhibits good compatibility (i.e., miscibility) with hydrogenated cycloaliphatic hydrocarbon resins, if used, so that a transparent film can be formed. Furthermore, the polyisobutylene resins have low surface energy and therefore can enable spreadability of the adhesive onto an adherent and the generation of voids at the interface is minimized. In addition, the glass transition temperature and the moisture permeability are low and therefore, the polyisobutylene resins are suitable as the base resin of the adhesive encapsulating composition.

The polyisobutylene resins may have desirable viscoelastic properties that, in general, can be used to impart a desired degree of fluidity to the adhesive encapsulating composition. A strain rheometer may be used to determine elastic (storage) modulus, G', and viscous (loss) modulus, G", at various temperatures. G' and G" can then be used to determine the ratio $\tan(\delta)=G''/G'$. In general, the higher the $\tan(\delta)$ value, the more the material is like a viscous material, and the lower the $\tan(\delta)$ value, the more the material is like an elastic solid. In some embodiments, the polyisobutylene resin may be selected such that the adhesive encapsulating composition has a $\tan(\delta)$ value at relatively low frequency of at least about 0.5 when the composition is at temperatures of from about 70° C. to about 110° C. In this way, the composition is able to flow sufficiently over uneven surfaces with little or no air entrapment.

The resin systems of the invention also include a tackifier. In general, a tackifier can be any compound or mixture of compounds that increases the tackiness of the adhesive encapsulating composition. Desirably, the tackifier does not increase moisture permeability. The tackifier may comprise a hydrogenated hydrocarbon resin, a partially hydrogenated hydrocarbon resin, a non-hydrogenated hydrocarbon resin, or a combination thereof. Preferably, the tackifier comprises a hydrogenated petroleum resin. In some embodiments, the resin system comprises about 15 to about 35 wt. %, about 20 to about 30 wt. %, or about 25 wt. %, of the tackifer relative to the total weight of the resin system.

Examples of tackifiers include, but are not limited to, hydrogenated terpene-based resins (for example, resins commercially available under the trade designation CLEARON P, M and K (Yasuhara Chemical)); hydrogenated resins or hydrogenated ester-based resins (for example, resins commercially available under the trade designation FORAL AX (Hercules Inc.); FORAL 105 (Hercules Inc.); PENCEL A (Arakawa Chemical Industries Co., Ltd.); ESTERGUM H (Arakawa Chemical Industries Co., Ltd.); and SUPER ESTER A (Arakawa Chemical Industries. Co., Ltd.); disproportionate resins or disproportionate ester-based resins (for example, resins commercially available under the trade designation PINECRYSTAL (Arakawa Chemical Industries Co., Ltd.); hydrogenated dicyclopentadiene-based resins which are hydrogenated resins of a C5-type petroleum resin obtained by copolymerizing a C5 fraction such as pentene, isoprene, piperine and 1,3-pentadiene produced through thermal decomposition of petroleum naphtha (for example, resins commercially available under the trade designations ESCOREZ 5300 and 5400 series (Exxon Chemical Co.); EASTOTAC H (Eastman Chemical Co.)); partially hydrogenated aromatic modified dicyclopentadiene-based resins (for example, resins commercially available under the trade designation ESCOREZ 5600 (Exxon Chemical Co.)); resins resulting from hydrogenation of a C9-type petroleum resin obtained by copolymerizing a C9 fraction such as indene, vinyltoluene and $\alpha$- or $\beta$-methylstyrene produced by thermal decomposition of petroleum naphtha (for example, resins commercially available under the trade designation ARCON P or ARCON M (Arakawa Chemical Industries Co., Ltd.)); resins resulting from hydrogenation of a copolymerized petroleum resin of the above-described C5 fraction and C9 fraction (for example, resin commercially available under the trade designation IMARV (Idemitsu Petrochemical Co.)).

Non-hydrogenated hydrocarbon resins include C5, C9, C5/C9 hydrocarbon resins, polyterpene resins, aromatics-modified polyterpene resins or rosin derivatives. If a non-hydrogenated hydrocarbon resin is used, it is typically used in combination with another hydrogenated or partially hydrogenated tackifier.

In some embodiments, the tackifier comprises a hydrogenated hydrocarbon resin, and particularly, a hydrogenated cycloaliphatic hydrocarbon resin. A specific example of a hydrogenated cycloaliphatic hydrocarbon resin includes ESCOREZ 5340 (Exxon Chemical). In some embodiments, the hydrogenated cycloaliphatic hydrocarbon resin is a hydrogenated dicyclopentadiene-based resin because of its low moisture permeability and transparency. Hydrogenated cycloaliphatic hydrocarbon resins that can be utilized in the adhesive encapsulating compositions typically have a weight average molecular weight from about 200 to 5,000 g/mol. In another embodiment, the weight average molecular weight of the hydrogenated cycloaliphatic hydrocarbon resin is from about 500 to 3,000 g/mol. If the weight average molecular weight exceeds 5,000 g/mol, poor tackification may result or the compatibility with the polyisobutylene resin may decrease.

The tackifier may have a softening temperature or point (ring and ball softening temperature) that may vary, depending at least in part, upon the adhesion of the composition, the temperature utilized, the ease of production, and the like. The ring and ball softening temperature can generally be from about 50 to 200° C. In some embodiments, the ring and ball softening temperature is from about 80 to 150° C. If the ring and ball softening temperature is less than 80° C., the tackifier may undergo separation and liquefaction due to heat generated upon the emission of light by the electronic device. This can cause deterioration of an organic layer such as a light-emitting layer when an organic electroluminescent device is encapsulated directly with an adhesive encapsulating composition. On the other hand, if the ring and ball softening point exceeds 150° C., the amount of tackifier added is so low that satisfactory improvement of relevant characteristics may not be obtained.

In some embodiments, the tackifier comprises a hydrogenated hydrocarbon resin, and particularly, a hydrogenated cycloaliphatic hydrocarbon resin. A specific example of a hydrogenated cycloaliphatic hydrocarbon resin includes ESCOREZ 5340 (Exxon Chemical). In some embodiments, the hydrogenated cycloaliphatic hydrocarbon resin is a hydrogenated dicyclopentadiene-based resin because of its low moisture permeability and transparency. Hydrogenated cycloaliphatic hydrocarbon resins that can be utilized in the adhesive encapsulating compositions typically have a weight average molecular weight from about 200 to 5,000 g/mol. In another embodiment, the weight average molecular weight of the hydrogenated cycloaliphatic hydrocarbon resin is from about 500 to 3,000 g/mol. If the weight average molecular weight exceeds 5,000 g/mol, poor tackification may result or the compatibility with the polyisobutylene resin may decrease.

The barrier adhesive composition of the invention also includes organically modified nanoclay. The nanoclay is typically a cation-substitutable mineral that has been treated with an organic modifier for compatibility with the resin system. In some embodiments, the nanoclay is about 100 to about 1000 nm in its longest dimension.

Suitable nanoclays materials include, for example, those in the geological classes of the smectites, the kaolins, the illites, the chlorites, the serpentines, the attapulgites, the palygorskites, the vermiculites, the glauconites, the sepiolites, and the mixed layer clays. Smectites, for example, can include montmorillonite, bentonite, pyrophyllite, hectorite, saponite, sauconite, nontronite, talc, beidellite, and volchonskoite. Kaolins, for example, can include kaolinite, dickite, nacrite, antigorite, anauxite, halloysite, indellite and chrysotile. Illites, for example, include bravaisite, muscovite, paragonite, phlogopite and biotite. Chlorites, for example, can include corrensite, penninite, donbassite, sudoite, pennine and clinochlore. Mixed layer clays, for example, can include allevardite and vermiculitebiotite. Variants and isomorphic substitutions of these layered clay minerals offer unique applications. Preferably, montmorillonite, bentonite or a combination thereof is used.

Suitable organic modifiers include, for example, one having a dimethyl benzyl hydrogenated tallow quaternary ammonium ion, a bis(hydrogenated tallow) dimethyl quaternary ammonium ion, a methyl tallow bis-2-hydroxyethyl quaternary ammonium ion, a dimethyl hydrogenated tallow 2-ethylhexyl quaternary ammonium ion or a dimethyl dehydrogenated tallow quaternary ammonium ion.

In some embodiments the barrier adhesive compositions of the invention are solvent-based adhesives. Any useful solvent that dissolves the resins may be utilized. Examples of suitable solvents include heptane, toluene, xylene, benzene, ethylbenzene and hexane (preferably, heptane, toluene or a combination thereof; more preferably, heptane). Is some embodiments, it can be preferable that the solvent has a boiling point below about 200° C.

In some embodiments the solvent comprises about 65 to about 95 wt. %, about 70 to about 90 wt. %, about 75 to about 85 wt. %, or about 80 wt. %, of the total barrier adhesive composition.

The barrier adhesive compositions of the invention can be prepared by various methods known to those of skill in the art. For example, the barrier adhesive compositions can be prepared by thoroughly mixing the above-described components. For mixing the composition, an arbitrary mixer such as a kneader or an extruder can be used. In some embodiments, the compositions may be prepared, for example, by preparing a mixture of the resin system with solvent, dispersing the organically modified nanoclay into solvent and then combining the resin mixture with the nanoclay dispersion.

The barrier adhesive compositions of the invention exhibit good visible light transmittance and low haze. In some embodiments, the barrier adhesive composition has a visible light transmittance of about 90% or greater. In some embodiments, the barrier adhesive composition has a haze of about 3% or less, or about 2% or less.

The barrier adhesive compositions of the invention are typically non-curable or non-reactive compositions. Non-curable compositions are advantageous because they do not require the use of migratory species such as initiators. They also eliminate the need for high temperature curing, which can damage the underlying device. The compositions can be, for example, solvent-based drying adhesives, pressure-sensitive adhesives, contact adhesives or hot melt adhesives. Preferably, the compositions are solvent-based drying adhesives that harden upon drying. As the solvent evaporates, the viscosity of the increases and the adhesive composition hardens.

The barrier adhesive compositions of the invention can be applied to a substrate, a device or any device components by any useful coating process. Solvent based drying adhesives are typically applied by brush, roller, bead or ribbon, or spray. The barrier adhesive composition can be coated onto an appropriate substrate to form a barrier adhesive article.

The barrier adhesive composition can, for example, be coated onto a gas-barrier film and allowed to dry to form an adhesive barrier film. Gas-barrier films have a low permeability to oxygen and can be used to help prevent goods such as foods, electronics and pharmaceutical products from being deteriorated by contact with oxygen. Typically food grade gas-barrier films have oxygen transmission rates of less than about 1 $cm^3/m^2$/day at 20° C. and 65% relative humidity. Preferably, the gas-barrier film also has barrier properties to moisture.

Examples of polymeric gas-barrier films include ethyl vinyl alcohol copolymer (EVOH) films such as polyethylene EVOH films and polypropylene EVOH films; polyamide films such as coextruded polyamide/polyethylene films, coextruded polypropylene/polyamide/polypropylene films; and polyethylene films such as low density, medium density or high density polyethylene films and coextruded polyethylene/ethyl vinyl acetate films. Polymeric gas-barrier films can also be metallized, for example, coating a thin layer of metal such as aluminum on the polymer film.

Examples of inorganic gas-barrier films include films comprising silicon oxide, silicon nitride, silicon oxynitride, aluminum oxide, diamond-like films, diamond-like glass and foils such as aluminum foil.

Preferably, the gas-barrier film is flexible. For some applications, it is also preferable that the gas-barrier film be visible light-transmissive. As used herein, the term "visible light-transmissive" means having an average transmission over the visible portion of the spectrum (for example, between 400 nm and 700 nm) of at least about 80%, preferably at least about 88% or 90%.

For some applications, protection from moisture and oxygen is required. For particularly sensitive applications an "ultra-barrier film" may be necessary. Ultra-barrier films typically have an oxygen transmission rate less than about 0.005 $cc/m^2$/day at 23° C. and 90% RH and a water vapor transmission rate of less than about 0.005 g/m2/day at 23° C. and 90% RH. Surprisingly, it has been discovered that there is a substantial improvement in the barrier performance of ultra-barrier films when they are coated with the barrier adhesive compositions of the invention.

Some ultra-barrier films are multilayer films comprising an inorganic visible light-transmissive layer disposed between polymer layers. One example of a suitable ultra-barrier film comprises a visible light-transmissive inorganic barrier layer disposed between polymers having a glass transition temperature (Tg) greater than or equal to that of heat-stabilized polyethylene terephthalate (HSPET).

A variety of polymers having a Tg greater than or equal to that of HSPET can be employed. Volatilizable monomers that form suitably high Tg polymers are especially preferred. Preferably the first polymer layer has a Tg greater than that of PMMA, more preferably a Tg of at least about 110° C., yet more preferably at least about 150° C., and most preferably at least about 200° C. Especially preferred monomers that can be used to form the first layer include urethane acrylates (e.g., CN-968, Tg=about 84° C. and CN-983, Tg=about 90° C., both commercially available from Sartomer Co.), isobornyl acrylate (e.g., SR-506, commercially available from Sartomer Co., Tg=about 88° C.), dipentaerythritol pentaacrylates (e.g., SR-399, commercially available from Sartomer Co., Tg=about 90° C.), epoxy acrylates blended with styrene (e.g., CN-120S80, commercially available from Sartomer Co., Tg=about 95° C.), di-trimethylolpropane tetraacrylates (e.g., SR-355, commercially available from Sartomer Co., Tg=about 98° C.), diethylene glycol diacrylates (e.g., SR-230, commercially available from Sartomer Co., Tg=about 100° C.), 1,3-butylene glycol diacrylate (e.g., SR-212, commercially available from Sartomer Co., Tg=about 101° C.), pentaacrylate esters (e.g., SR-9041, commercially available from Sartomer Co., Tg=about 102° C.), pentaerythritol tetraacrylates (e.g., SR-295, commercially available from Sartomer Co., Tg=about 103° C.), pentaerythritol triacrylates (e.g., SR-444, commercially available from Sartomer Co., Tg=about 103° C.), ethoxylated (3) trimethylolpropane triacrylates (e.g., SR-454, commercially available from Sartomer Co., Tg=about 103° C.), ethoxylated (3) trimethylolpropane triacrylates (e.g., SR-454HP, commercially available from Sartomer Co., Tg=about 103° C.), alkoxylated trifunctional acrylate esters (e.g., SR-9008, commercially available from Sartomer Co., Tg=about 103° C.), dipropylene glycol diacrylates (e.g., SR-508, commercially available from Sartomer Co., Tg=about 104° C.), neopentyl glycol diacrylates (e.g., SR-247, commercially available from Sartomer Co., Tg=about 107° C.), ethoxylated (4) bisphenol a dimethacrylates (e.g., CD-450, commercially available from Sartomer Co., Tg=about 108° C.), cyclohexane dimethanol diacrylate esters (e.g., CD-406, commercially available from Sartomer Co., Tg=about 110° C.), isobornyl methacrylate (e.g., SR-423, commercially available from Sartomer Co., Tg=about 110° C.), cyclic diacrylates (e.g., SR-833, commercially available from Sartomer Co., Tg=about 186° C.) and tris (2-hydroxy ethyl) isocyanurate triacrylate (e.g., SR-368, commercially available from Sartomer Co., Tg=about 272° C.), acrylates of the foregoing methacrylates and methacrylates of the foregoing acrylates.

The first polymer layer can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating) or spray coating (e.g., electrostatic spray coating), then crosslinked as set out above. The first polymer layer can also be formed by applying a layer containing an oligomer or polymer in solvent and drying the thus-applied layer to remove the solvent. Plasma polymerization may also be employed if it will provide a polymeric layer having a glassy state at an elevated temperature, with a glass transition temperature greater than or equal to that of HSPET. Most preferably, the first polymer layer is formed by flash evaporation and vapor deposition followed by crosslinking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

The smoothness and continuity of each polymer layer and its adhesion to the underlying layer preferably is enhanced by appropriate pretreatment. A preferred pretreatment regimen employs an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric layer. Plasma pretreatment is particularly preferred. A separate adhesion promotion layer which may have a different composition than the high Tg polymer layer may also be utilized atop an underlying layer to improve interlayer adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the first polymer layer will depend in part on the nature and surface topography of the support. The thickness preferably is sufficient to provide a smooth, defect-free surface to which the subsequent first inorganic barrier layer can be applied. For example, the first polymer layer may have a thickness of a few nm (e.g., 2 or 3 nm) to about 5 µm, and can be thicker if desired.

One or more visible light-transmissive inorganic barrier layers separated by a polymer layer having a Tg greater than or equal to that of HSPET lie atop the first polymer layer. These layers can respectively be referred to as the "first inorganic barrier layer", "second inorganic barrier layer" and "second polymer layer". Additional inorganic barrier layers and polymer layers can be present if desired, including polymer layers that do not have a Tg greater than or equal to that of HSPET. Preferably however each neighboring pair of inorganic barrier layers is separated only by a polymer layer or layers having a Tg greater than or equal to that of HSPET, and more preferably only by a polymer layer or layers having a Tg greater than that of PMMA.

The inorganic barrier layers do not have to be the same. A variety of inorganic barrier materials can be employed. Preferred inorganic barrier materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially preferred inorganic barrier materials. ITO is an example of a special class of ceramic materials that can become electrically conducting with the proper selection of the relative proportions of each elemental constituent. The inorganic barrier layers preferably are formed using techniques employed in the film metallizing art such as sputtering (e.g., cathode or planar magnetron sputtering), evaporation (e.g., resistive or electron beam evaporation), chemical vapor deposition, atomic layer deposition, plating and the like. Most preferably the inorganic barrier layers are formed using sputtering, e.g., reactive sputtering. Enhanced barrier properties have been observed when the inorganic layer is formed by a high energy deposition technique such as sputtering compared to lower energy techniques such as conventional chemical vapor deposition processes. The smoothness and continuity of each inorganic barrier layer and its adhesion to the underlying layer can be enhanced by pretreatments (e.g., plasma pretreatment) such as those described above with reference to the first polymer layer.

The inorganic barrier layers do not have to have the same thickness. The desired chemical composition and thickness of each inorganic barrier layer will depend in part on the nature and surface topography of the underlying layer and on the desired optical properties for the barrier assembly. The inorganic barrier layers preferably are sufficiently thick so as to be continuous, and sufficiently thin so as to ensure that the barrier assembly and articles containing the assembly will have the desired degree of visible light transmission and flexibility. Preferably the physical thickness (as opposed to the optical thickness) of each inorganic barrier layer is about 3 to about 150 nm, more preferably about 4 to about 75 nm.

The second polymer layers that separate the first, second and any additional inorganic barrier layers do not have to be the same, and do not all have to have the same thickness. A variety of second polymer layer materials can be employed. Preferred second polymer layer materials include those mentioned above with respect to the first polymer layer. Preferably the second polymer layer or layers are applied by flash evaporation and vapor deposition followed by cross-linking in situ as described above with respect to the first polymer layer. A pretreatment such as those described above (e.g., plasma pretreatment) preferably also is employed prior to formation of a second polymer layer. The desired chemical composition and thickness of the second polymer layer or layers will depend in part on the nature and surface topography of the underlying layer(s). The second polymer layer thickness preferably is sufficient to provide a smooth, defect-free surface to which a subsequent inorganic barrier layer can be applied. Typically the second polymer layer or layers may have a lower thickness than the first polymer layer. For example, each second polymer layer may have a thickness of about 5 nm to about 10 µm, and can be thicker if desired.

Flexible visible light-transmissive ultra-barrier films and their manufacture are described, for example, in U.S. Pat. No. 7,940,004 (Padiyath et al.), which is herein incorporated by reference.

Commercially available ultra-barrier films include, for example, FTB 3-50 and FTB 3-125 available from 3M Company.

The gas-barrier film coated with a layer of the adhesive barrier composition of the invention may be provided on a substrate. The substrate is preferably flexible and visible light-transmissive. Suitable substrate materials include organic polymeric materials such as polyethylene terephthalate (PET), polyacrylates, polycarbonate, silicone, epoxy resins, silicone-functionalized epoxy resins, polyester such as Mylar (made by E. I. du Pont de Nemours & Co.), polyimide such as Kapton H or Kapton E (made by du Pont), Apical AV (made by Kanegafugi Chemical Industry Company), Upilex (made by UBE Industries, Ltd.), polyethersulfones (PES, made by Sumitomo), polyetherimide, polyethylenenaphthalene (PEN), polymethyl methacrylate, styrene/acrylonitrile, styrene/maleic anhydride, polyoxymethylene, polyvinylnaphthalene, polyetheretherketon, polyaryletherketone, high Tg fluoropolymers (for example, DYNEON™ HTE terpolymer of hexafluoropropylene, tetrafluoroethylene, and ethylene), poly α-methyl styrene, polyarylate, polysulfone, polyphenylene oxide, polyamideimide, polyimide, polyphthalamide, polyethylene, and polypropylene. Colorless polyimide, cyclic olefin copolymer and cyclic olefin copolymer can also be utilized. Preferably the substrate comprises PET.

FIG. 1 shows a cross-sectional structure of an exemplary barrier film construction 100 comprising substrate 110, gas-barrier film 120 (preferably, an ultra-barrier film), and barrier adhesive layer 130. In some embodiments, the barrier adhesive layer has a thickness of about 5 to about 50 µm. In some embodiments, the barrier film construction has a thickness of about 20 to about 250 µm.

In some embodiments, the outer surface of the barrier adhesive layer can be protected with means such as a release liner (140). Any useful release liner such as, for example, a film or sheet treated with a release agent (e.g. a silicone resin) can be used. The end user can remove the release liner to adhere the barrier construction to device it will protect.

Alternatively, the barrier adhesives of the invention can be provided to an end user disposed between two release liners.

The barrier film constructions of the invention can be used for protection from oxygen and moisture in OLED displays and solid state lighting, solar cells, electrophoretic and electrochromic displays, thin film batteries, quantum dot devices, sensor and other organic electronic devices. They are especially well-suited for applications that require oxygen and moisture protection as well flexibility and good optical transmittance.

Figure 2:
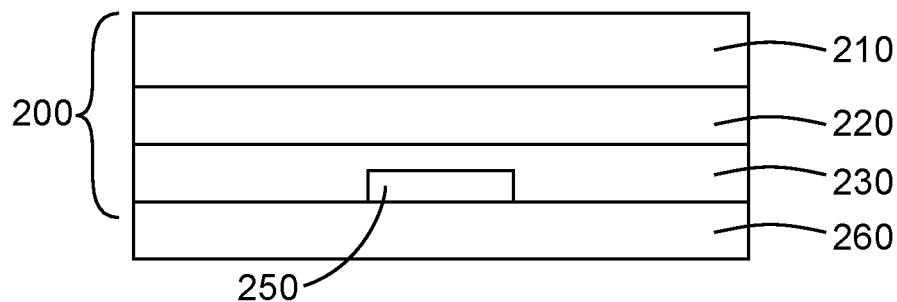
FIG. 2 is a schematic representation of an encapsulated organic device.

FIG. 2 shows a barrier film construction of the invention being used to encapsulate an organic electronic device such as, for example, an OLED. Organic electronic device 250 is disposed on device substrate 260. Organic electronic device 250 is encapsulated with barrier film construction 200, which includes ultra-barrier film 220 and barrier adhesive layer 230, and device substrate 260.

Examples

Objects and advantages of this invention are further illustrated by the following examples, but the particular materials and amounts thereof recited in these examples, as well as other conditions and details, should not be construed to unduly limit this invention.

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company, St. Louis, Mo., unless otherwise noted.

Materials

Escorez 5300 hydrogenated petroleum hydrocarbon resin was purchased from ExxonMobil Chemical Company (Houston, Tex.). Clearon P105 was obtained from Yasuhara Chemical (Fuchu-city, Japan). Polyisobutylene with formula weights of: (i) 400,000 g/mol (Oppanol B50 SF); (ii) 800,000 g/mol (Oppanol B80); (iii) 1,110,000 g/mol (Oppanol B100) were obtained from BASF (Florham Park, N.J.). Exxon Butyl 268 butyl rubber was obtained from Exxon-Mobil Chemical (Houston, Tex.). Heptane and toluene were purchased from VWR International (Radnor, Pa.). Xylene was obtained from EMD (Gibbstown, N.J.). Rolls of SKC-12N and SKC-02N release liner were purchased from SKC Haas (Seoul, Korea). A roll of M74F release liner was obtained from Siliconature (Godega di Sant'Urbano, Italy). Aldrich 682640 surface modified nanoclay was purchased from Sigma-Aldrich (Saint Louis, Mo.). Claytone APA organophilic bentonite, Claytone AF organophilic bentonite, and Cloisite-20 microgranulated nanoclay were obtained from BYK (Wesel, Germany).

Preparation of Polyisobutylene-Based Adhesive Mixtures

The polyisobutylene and butyl rubber polymer resins were first diced into approximately 1 inch cubes. These resin cubes were then added, along with tackifier, to either heptane or toluene, and the resulting formulations were mixed on rollers for 1-2 weeks. The polyisobutylene-based adhesive solutions used in this work are described in Table 1, and the "Parts" listed in the "Polymeric Resin" column of Table 1 are parts by weight.

TABLE 1

Polyisobutylene-based adhesive formulations.

| Preparative Example | Polymeric Resin | Tackifier | Polymer/Tackifier Wt Ratio | Solvent | Wt % Solids |
|---|---|---|---|---|---|
| PE1 | 2 Parts B80:1 Part B50 | Escorez 5300 | 3:1 | Heptane | 25 |
| PE2 | 2 Parts B80:1 Part B50 | Escorez 5300 | 3:1 | Toluene | 25 |
| PE3 | Exxon Butyl 268 | None | N/A | Heptane | 25 |
| PE4 | B50 | Escorez 5300 | 85:15 | Heptane | 25 |
| PE5 | B100 | Clearon P105 | 3:2 | Xylenes | 11.1 |

Preparation of Polyisobutylene/Clay Mixtures

Montmorillonite clays were dispersed into organic solvent by adding the clay powder directly to either heptane or toluene at the wt % solids specified in Table 2. Then, the clay was mixed into the toluene or heptane solvent using either:
  (i) an IKA® T25 digital Ultra-Turrax high-shear mixer (IKA® Works, Inc., Wilmington, N.C.) at the specified rotational speed for the specified time, or
  (ii) a Sonics Vibra Cell VCX750 sonicator (Sonics & Materials Inc., Newtown, Conn.) at the specified amplitude for the specified length of time.

TABLE 2

Montmorillonite clay dispersions.

| Preparative Example | Clay Powder | Solvent | Wt % Solids | Dispersion Protocol |
|---|---|---|---|---|
| PE6 | Aldrich 682640 | Toluene | 20 | Shear (11.6 krpm for 10 min, then 20 krpm for 24 min) |
| PE7 | Aldrich 682640 | Toluene | 20 | Sonicate (57%, 30 min) |
| PE8 | Claytone APA | Heptane | 5 | Sonicate (100%, 40 min) |
| PE9 | Claytone AF | Heptane | 8 | Sonicate (100%, 60 min) |
| PE10 | Claytone AF | Heptane | 5 | Shear (11.0 krpm, 30 min) |
| PE11 | Claytone AF | Heptane | 10 | Shear (20.2 krpm, 13 min) |
| PE12 | Cloisite-20 | Xylenes | 5 | Shear (5.0 krpm, 60 min) |

To prepare PE13-PE22, the montmorillonite clay dispersions of Table 2 were combined with the polyisobutylene-based polymer solutions of Table 1 and mixed on rollers for 1 week. The resultant nanoclay-filled polyisobutylene-based adhesive formulations are summarized in Table 3.

TABLE 3

Nanoclay-filled polyisobutylene-based adhesive formulations used to coat substrates.

| Preparative Example | Polymeric Binder | Clay Additive | Polymer/Clay Wt Ratio | Solvent | Wt % Solids |
|---|---|---|---|---|---|
| PE13 | PE2 | PE6 | 90:10 | Toluene | 20 |
| PE14 | PE2 | PE7 | 90:10 | Toluene | 20 |
| PE15 | PE1 | PE8 | 98:2 | Heptane | 20 |
| PE16 | PE1 | PE8 | 95:5 | Heptane | 19 |
| PE17 | PE1 | PE8 | 90:10 | Heptane | 16 |
| PE18 | PE1 | PE8 | 88:12 | Heptane | 15 |
| PE19 | PE1 | PE9 | 92:8 | Heptane | 18 |
| PE20 | PE3 | PE10 | 90:10 | Heptane | 20 |
| PE21 | PE4 | PE11 | 90:10 | Heptane | 25 |
| PE22 | PE5 | PE12 | 100:10 | Xylenes | 10 |

Coating of Adhesive Formulations onto Film Substrates

Three different film substrates were used: a porous polypropylene support film (F1); 3M food-grade oxide barrier film (F2); and 3M FTB3-50 (3M Company, Maplewood, Minn.) ultrabarrier film (F3). The properties of these film substrates are summarized in Table 4.

TABLE 4

Film samples evaluated.

| Film Identifier | Base Film | Barrier Layer | Film Supplier | Descriptor of Film |
|---|---|---|---|---|
| F1 | Polypropylene | — | 3M | Polypropylene Support Film |
| F2 | PET | Sputtered oxide | 3M | 3M Food-Grade Barrier Film |
| F3 | PET | Alternating polymer/inorganic layers | 3M | 3M FTB3-50 Ultrabarrier Film |

To prepare handspread samples, the adhesive mixtures were coated onto SKC-12N release liner using a benchtop notch bar coater. The coated samples were placed in an oven at 80° C. for 20 minutes to remove the solvent. The dry thickness of these samples was 25 μm. The M74F release liner was then laminated to the adhesive so that the adhesive was sandwiched between the two release liners. For CE2 and EX8, the adhesive was coated directly onto 3M food-grade barrier film (F2) and dried at 80° C. for 20 minutes. The M74F release liner was then laminated to the adhesive.

To prepare samples EX3 and EX9, the adhesive mixtures were coated onto SKC-12N release liner using a Hirano pilot coater equipped with a notch bar. The adhesive was dried in an oven at 80° C. for 1 minute and in another oven at 130° C. for 1 minute. The dry thickness of these samples was 25 μm. The M74F release liner was then laminated to the adhesive so that the adhesive was sandwiched between the two release liners.

Figure 3:
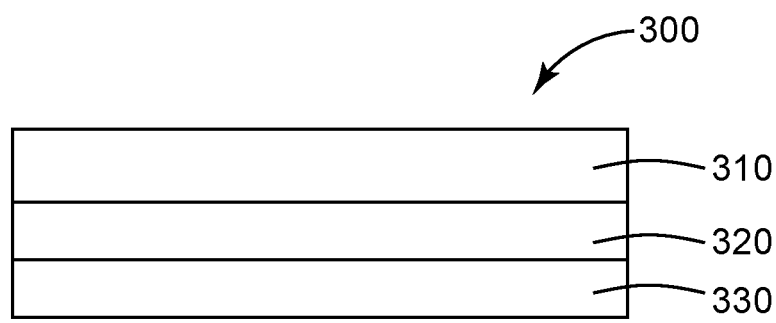
FIG. 3 is a schematic representation of an ultra-barrier film that is coated with a clay-filled barrier adhesive.

The adhesive was transferred from the release liners to a porous polypropylene film (F1) for bulk water vapor transmission rate (WVTR) testing, to a 3M food-grade barrier film (F2) for calcium testing, and to a 3M ultrabarrier film (F3) for peel testing, shear testing, and calcium testing. A schematic representation of the adhesive-coated barrier film construction is provided in FIG. 3. A summary of all of the coated samples that were tested in this work is provided in Table 5. The ratios in the "Adhesive Descriptor" column of Table 5 are weight ratios.

TABLE 5

Adhesive-coated film samples evaluated.

| Adhesive Example | Adhesive Formulation | Adhesive Descriptor | Coating Method |
|---|---|---|---|
| 2 PIB MW Blend (Toluene) | | | |
| CE1 | PE2 | PIB | Handspread |
| EX1 | PE13 | 90/10 PIB/Clay (Aldrich 682640) | Handspread |
| EX2 | PE14 | 90/10 PIB/Clay (Aldrich 682640) | Handspread |
| EX3 | PE14 | 90/10 PIB/Clay (Aldrich 682640) | Hirano |
| 2 PIB MW Blend (Heptane) | | | |
| CE2 | PE1 | PIB | Handspread |
| EX4 | PE15 | 98/2 PIB/Clay (Claytone APA) | Handspread |
| EX5 | PE16 | 95/5 PIB/Clay (Claytone APA) | Handspread |
| EX6 | PE17 | 90/10 PIB/Clay(Claytone APA) | Handspread |
| EX7 | PE18 | 88/12 PIB/Clay(Claytone APA) | Handspread |
| EX8 | PE17 | 90/10 PIB/Clay (Claytone AF) | Handspread |
| EX9 | PE19 | 92/8 PIB/Clay (Claytone AF) | Hirano |
| Butyl Rubber | | | |
| CE3 | PE3 | Butyl Rubber | Handspread |
| EX10 | PE20 | 90/10 BR/Clay (Claytone AF) | Handspread |
| Lower MW PIB w/ Less Tackifier | | | |
| CE4 | PE4 | B50/Tackifier | Handspread |
| EX11 | PE21 | 90/10 B50/Clay (Claytone AF) | Handspread |

TABLE 5-continued

Adhesive-coated film samples evaluated.

| Adhesive Example | Adhesive Formulation | Adhesive Descriptor | Coating Method |
|---|---|---|---|
| Prior Art Example - Higher MW PIB w/ More Tackifier | | | |
| EX12 | PE22 | 100:10 PIB/Clay (Cloisite-20) | Handspread |

Peel and Shear Testing

Figure 4:
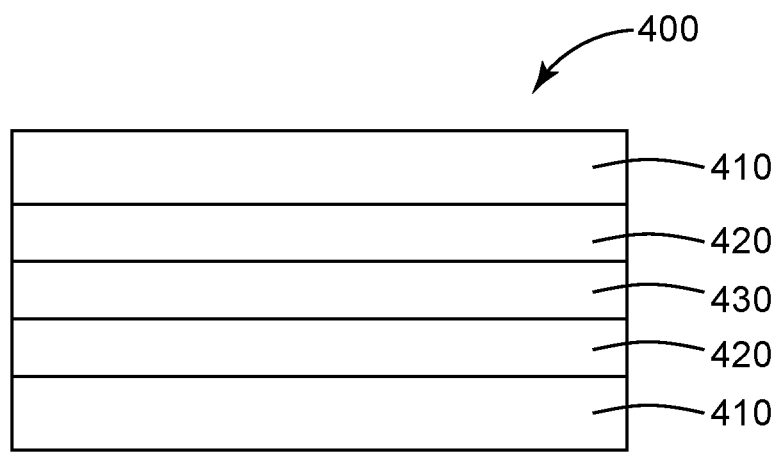
FIG. 4 is a schematic representation of the construction used for peel testing samples.

Peel testing was done using a T-Peel test according to ASTM D1876. The 25 μm adhesive was transferred from the release liners and laminated between two sheets of barrier film F3 so that the barrier coatings on these barrier film sheets faced the adhesive as depicted schematically in FIG. 4. In accordance with ASTM D1876, there was a 2 hour dwell time after transferring the adhesive to the barrier film. The 0.5" wide samples were evaluated at room temperature. The peel testing was done using an IMASS SP-2000 Peel Tester (IMASS, Inc., Accord, Mass.) outfitted with a SPA2-02 T-Peel Fixture. Three replicate measurements were taken and the average is reported.

Shear testing was completed in accordance with ASTM D3654/D3654M Procedure A. The 25 μm adhesive was transferred to a barrier film with the barrier coating facing the adhesive. The adhesive-backed barrier film was then adhered to a stainless steel plate. The shear adhesion performance was evaluated using a CREX Research Systems (Saint Paul, Minn.) shear testing stand at 23° C. and 50% RH. A 1 kg weight was hung from each samples and the amount of time it took for the adhesive to fail cohesively was recorded. Three replicate measurements were taken and the average is reported.

Bulk WVTR Testing

Moisture permeabilities of adhesive formulations were tested using a Mocon Permatran-W Model 1/50 G (Mocon, Inc., Minneapolis, Minn.). These experiments were completed at 40° C. and 100% RH with 50 cm² of sample area. Samples were prepared by transferring a 25 µm thick slab of adhesive onto a porous polypropylene film (F1). The sample was then folded in half so that there was 50 um of adhesive between two porous polypropylene films. These samples were then placed in the Permatran instrument for testing.

Calcium Testing

The adhesive-coated test substrate was first baked in vacuum at 80° C. until moisture was removed. Reflective metallic calcium was thermally deposited on specified regions of a glass substrate (e.g., an array of squares). The adhesive-backed film was disposed on the calcium-coated glass substrate, and this sandwich was laminated. A schematic representation of this laminated article is provided in FIG. 5 (where 570 is the glass substrate and 580 is calcium), along with some approximate layer thicknesses. The adhesive was 25 µm thick in each of the examples. Using a densitometer, optical density was measured at the initial time. The sample was then kept in an environmental chamber for accelerated aging at 60° C./90% relative humidity. For the first three days, optical densities were measured twice per day. Optical density was then measured once per day until the optical density was 50% of the initial density. The water vapor transmission rate (WVTR) is directly proportional to the time needed for the optical density to reach 50% of its initial value. The barrier films used in the calcium testing were either 3M FTB3-50 ultrabarrier film (F3) or 3M food grade barrier film (F2).

Peel and Shear Data for the Filled and Unfilled Adhesive Samples

The peel and shear data for the clay-filled examples EX13-EX22 and unfilled adhesive control samples CE5-CE7 are provided in Table 6. In Table 6, the ratios in the "Adhesive Descriptor" column are weight ratios. In general, the peel adhesion strength decreased as nanoclay was added to the adhesive, while the shear adhesion strength increased as clay filler was added. The adhesive performances of these samples were generally in the range that are acceptable for laminating film to substrates. EX19 was not tested for peel force.

TABLE 6

Peel and shear testing data for the adhesive-coated film samples evaluated.

| Example | Adhesive | Adhesive Descriptor | Peel Adhesion (oz/in) | Shear Adhesion (minutes) |
|---|---|---|---|---|
| 2 PIB MW Blend | | | | |
| CE5 | CE1 | PIB | 25.36 | 499 |
| EX13 | EX1 | 90/10 PIB/Clay | 13.74 | 728 |
| EX14 | EX2 | 90/10 PIB/Clay | 15.25 | 1193 |
| EX15 | EX3 | 90/10 PIB/Clay | 14.26 | 1113 |
| EX16 | EX4 | 98/2 PIB/Clay | 25.01 | 595 |
| EX17 | EX5 | 95/5 PIB/Clay | 17.60 | 928 |
| EX18 | EX6 | 90/10 PIB/Clay | 6.95 | 1181 |
| EX19 | EX7 | 88/12 PIB/Clay | N/A | 1195 |
| EX20 | EX9 | 92/8 PIB/Clay | 26.81 | 860 |

TABLE 6-continued

Peel and shear testing data for the adhesive-coated film samples evaluated.

| Example | Adhesive | Adhesive Descriptor | Peel Adhesion (oz/in) | Shear Adhesion (minutes) |
|---|---|---|---|---|
| Butyl Rubber | | | | |
| CE6 | CE3 | Butyl Rubber | 16.64 | 454 |
| EX21 | EX10 | 90/10 BR/Clay | 15.40 | 767 |
| Lower MW PIB w/ Less Tackifier | | | | |
| CE7 | CE4 | B50/Tackifier | 22.87 | 161 |
| EX22 | EX11 | 90/10 B50/Clay | 24.45 | 235 |
| Prior Art Example | | | | |
| EX23 | EX12 | 100/10 PIB/Clay | 13.81 | 3098 |

Bulk WVTR Data for the Filled and Unfilled Samples

WVTR data for two clay-filled adhesives and two unfilled adhesive controls are provided in Table 7. The WVTR values were measured using a MOCON Permatran-W Model 1/50 G operating at 40° C. and 100% RH. The test samples comprised 50 µm thick adhesive layers sandwiched between porous polypropylene film (F1). The addition of the nanoclay filler to the PIB adhesive CE1 did not result in a reduction in the WVTR, with both EX24 and EX25 being characterized by higher WVTR values than CE8.

TABLE 7

Water vapor transmission rates (WVTR) through filled and unfilled adhesive samples.

| Example | Adhesive | Adhesive Descriptor | WVTR (g/m² day) |
|---|---|---|---|
| CE8 | CE1 | PIB | 4.073 |
| EX24 | EX3 | 90/10 PIB/Clay | 4.452 |
| EX25 | EX9 | 92/8 PIB/Clay | 6.158 |
| CE9 | CE3 | Butyl Rubber | 4.496 |

Figure 6:
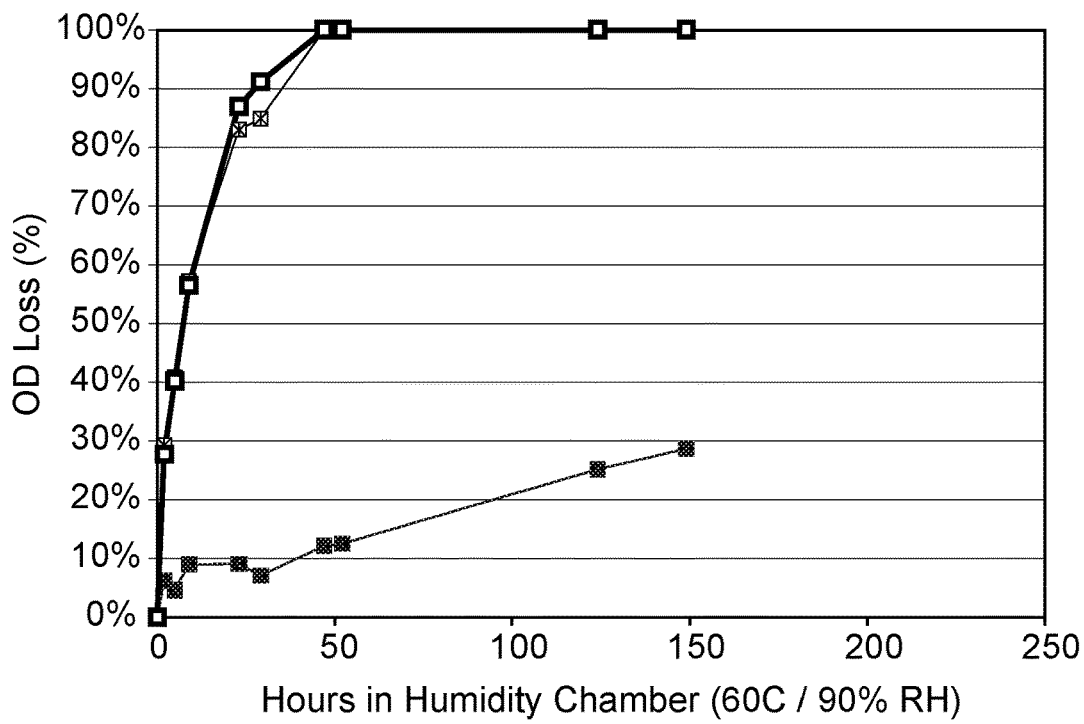
FIG. 6 is a plot of percent optical density loss versus time.

Calcium Test Barrier Performance Data for Adhesive-Backed Food Grade Barrier Films The calcium test barrier performance data for the adhesive-backed food-grade barrier film samples were prepared as described above and are summarized in Table 8 and FIGS. 6 and 7. Table 8 presents the time to 50% optical loss for the adhesive-backed food-grade barrier film samples CE10 and EX26. The data were acquired using calcium testing in an environmental chamber at a temperature of 60° C. and a relative humidity of 90%. FIG. 6 is a plot of percent optical density loss of the samples described in Table 8 versus time. The bold line with unfilled square markers is unfilled polyisobutylene adhesive on 3M Food-Grade Barrier Film (CE10). The line with star-filled makers is the filled polyisobutylene adhesive on 3M Food-Grade Barrier Film (EX26). The line with solid filled square markers is a control PIB barrier adhesive on 3M Ultrabarrier Film. FIG. 7 presents photographs of calcium onto which the food-grade barrier film constructions described in Table 8 have been laminated. The set of photographs at (a) were taken at time zero of samples made with unfilled polyisobutylene adhesive CE10; the set of photographs at (b) were taken at time zero of samples made with nanoclay-filled polyisobutylene adhesive EX26; the set of photographs at (c) were taken at 9 hours of samples made with unfilled polyisobutylene adhesive CE10; and the set of photographs at (d) were taken at 9 hours of samples made with nanoclay-filled polyisobutylene adhesive EX26.

Replacing the standard PIB adhesive with the 10 wt % clay-filled adhesive did not improve the performance of the laminated food-grade barrier film. The curves in FIG. 6 that represent the percent optical density change over time of the samples were nearly superimposed, and the measured time to 50% optical loss was seven hours for both samples. Furthermore, the photographs of the arrays of calcium squares provided in FIG. 7 are comparable. All of these data suggest that the barrier performances of CE2 and EX8 were indistinguishable. This conclusion is surprising in light of JP2012193335 and US20140377554, which teach that adding montmorillonite clay filler to the laminating adhesive will improve the performance of barrier film constructions having a wide range of barrier performance.

TABLE 8

Time to 50% optical loss for the adhesive-backed food-grade barrier film samples CE10 and EX26.

| Example | Adhesive | Film Descriptor | Adhesive Descriptor | Time to 50% Optical Loss (hours) |
|---|---|---|---|---|
| CE10 | CE2 | Food-Grade Barrier | PIB | 7 |
| EX26 | EX8 | Food-Grade Barrier | 90/10 PIB/Clay | 7 |

Calcium Test Barrier Performance Data for Adhesive-Backed Ultrabarrier Films

Figure 5:
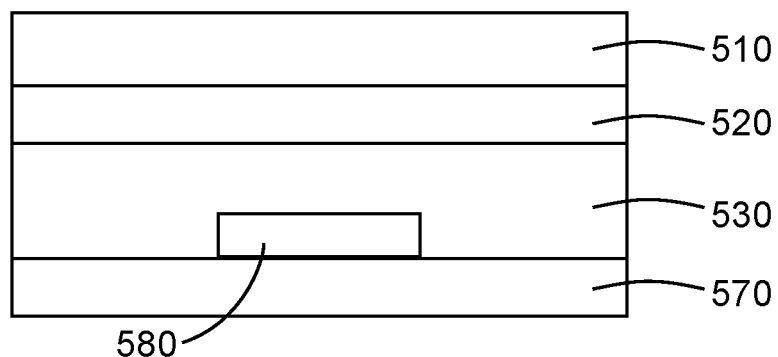
FIG. 5 is a schematic representation of the laminate construction used for calcium testing.
Figure 8:
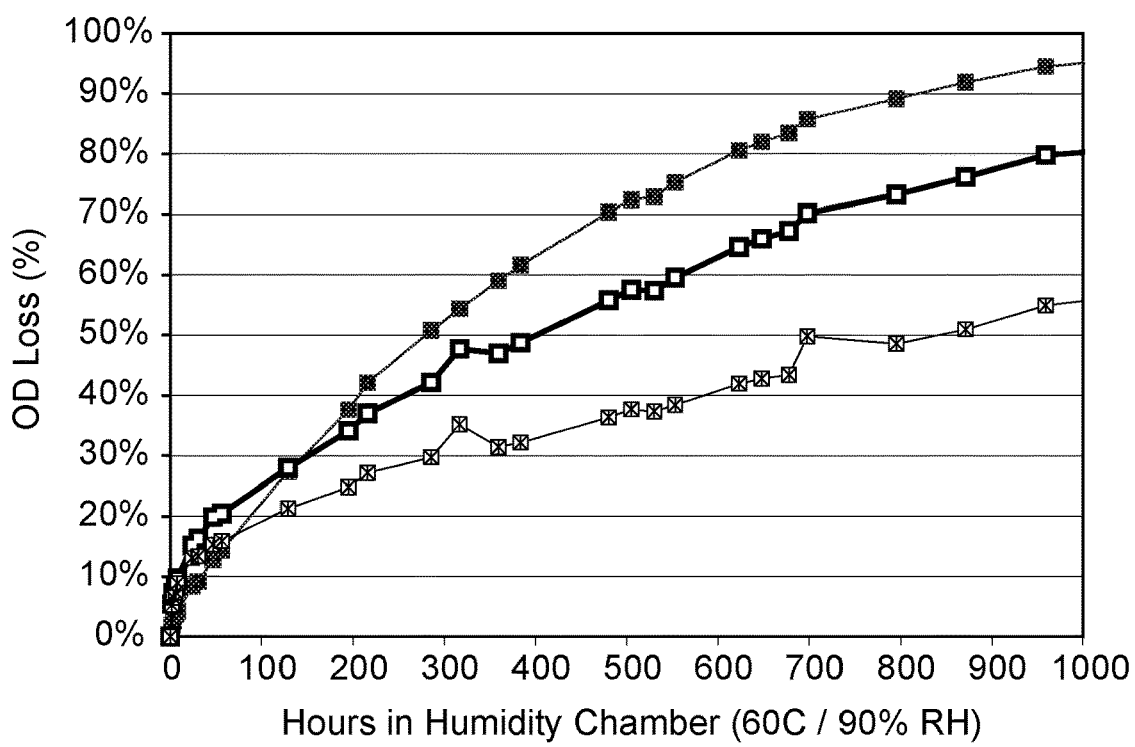
FIG. 8 is a plot of percent optical density loss versus time.
Figure 7A:
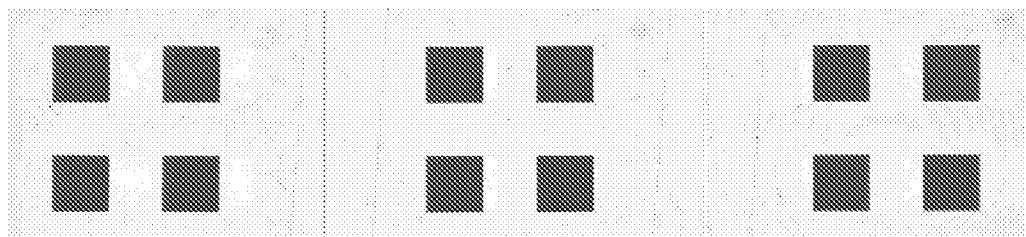
FIG. 7 presents photographs of calcium test specimens onto which food-grade barrier film constructions were laminated.
Figure 7B:
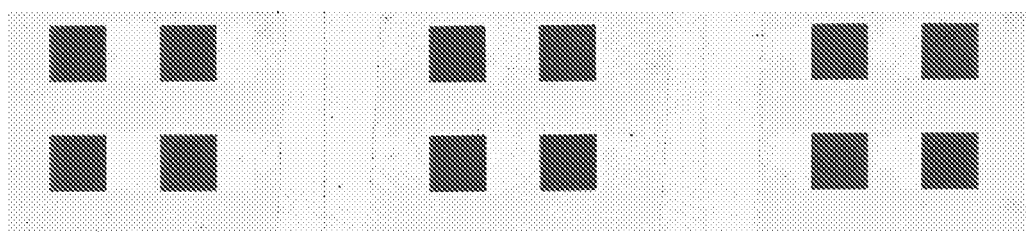
Figure 7C:
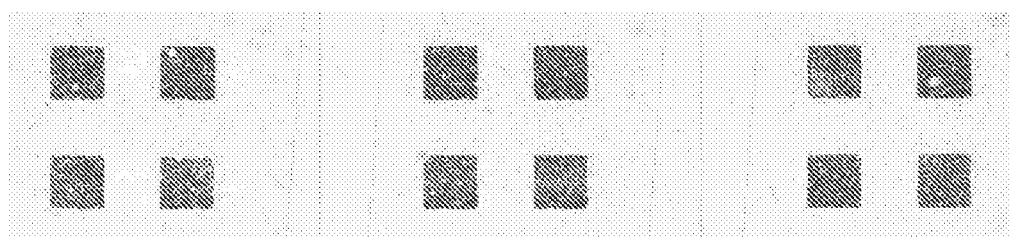
Figure 7D:
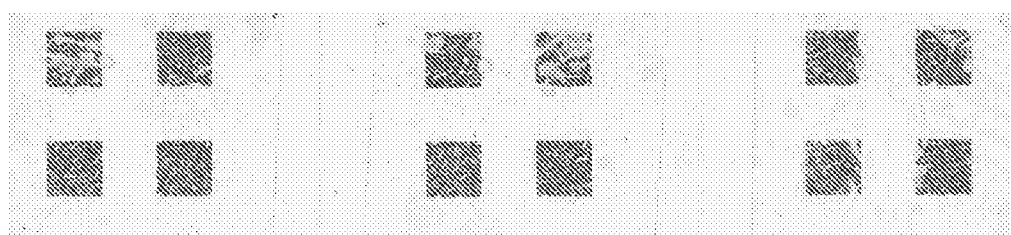
Figure 9A:
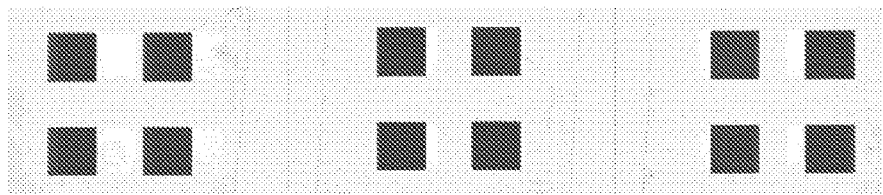
FIG. 9 presents photographs of calcium test specimens onto which ultra-barrier film constructions were laminated.
Figure 9B:
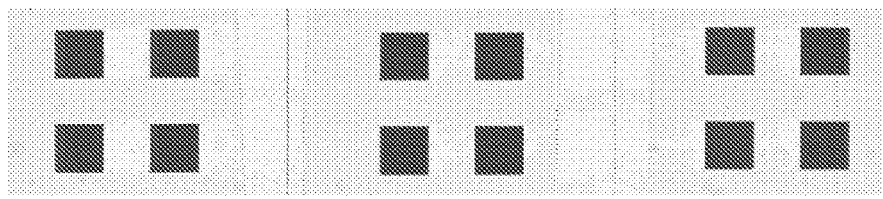
Figure 9C:
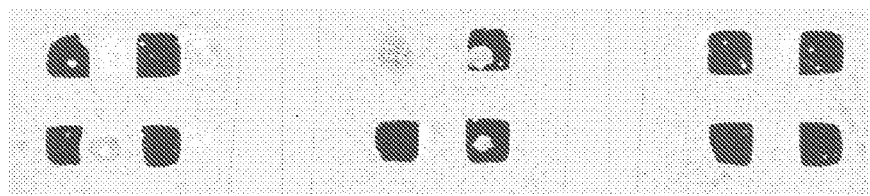
Figure 9D:
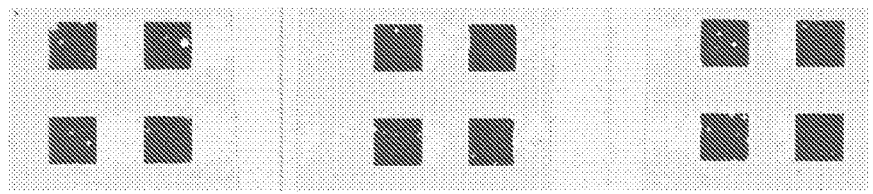
Figure 9E:
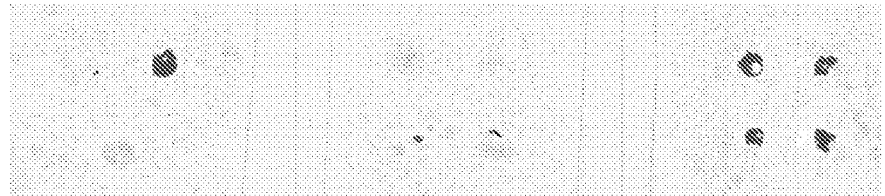
Figure 9F:
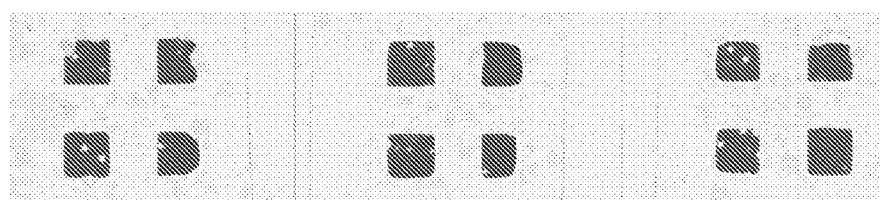

The calcium test barrier performance data for the adhesive-backed ultrabarrier films are summarized in Table 9 and FIGS. 6 and 7. All of the samples in Table 9 comprised nanoclay-filled adhesive applied to a single layer of ultrabarrier film, as shown in FIG. 5. The data were acquired using calcium testing in an environmental chamber at a temperature of 60° C. and a relative humidity of 90%. FIG. 8 is a plot of percent optical density loss of the samples described in Table 9 versus time. The line with unfilled square markers is polyisobutylene adhesive with nanoclay dispersed by high-shear mixing on 3M Ultrabarrier Film (EX27). The line with star-filled square makers is the polyisobutylene adhesive with nanoclay dispersed by sonication on 3M Ultrabarrier Film (EX28). The blue line with solid filled square markers is the control barrier adhesive on 3M Ultrabarrier Film (CE11 plus UV blocker). FIG. 9 presents photographs of calcium onto which ultrabarrier film constructions have been laminated. The set of photographs at (a) were taken at time zero of samples made with unfilled polyisobutylene adhesive CE11 plus UV blocker; the photographs at (b) where taken at time zero of samples made with nanoclay-filled polyisobutylene adhesive EX28; the photographs at (c) were taken at 360 hours of samples made with unfilled polyisobutylene adhesive CE11 plus UV blocker; the photographs at (d) were taken at 360 hours of samples made with nanoclay-filled polyisobutylene adhesive EX28; the photographs at (e) were taken at 959 hours of samples made with unfilled polyisobutylene adhesive CE11 plus UV blocker; and the photographs at (f) were taken at 959 hours of samples made with nanoclay-filled polyisobutylene adhesive EX28.

Unlike with the measurements of the WVTR through the adhesives themselves and the calcium test data for the food-grade laminates, these samples showed significant barrier performance improvement when montmorillonite clay was added to the adhesive formulation. The time to 50% optical loss was longer for every ultrabarrier sample that was backed with 25 μm thick clay-filled adhesive than for the comparable ultrabarrier samples laminated with 25 μm thick unfilled control adhesives (CE11 and CE12). The increase in time to 50% optical loss for the PIB samples ranged from a 27% increase for EX30 with 2 wt % nanoclay filler to a 183% increase for EX28 with 10 wt % nanoclay filler.

TABLE 9

Water vapor transmission performance data for the adhesive-backed ultrabarrier film samples.

| Example | Adhesive | Film Descriptor | Adhesive Descriptor | Time to 50% Optical Loss (hours) |
|---|---|---|---|---|
| | | 2 PIB MW Blend | | |
| CE11 | CE1 | Ultrabarrier | PIB | 300 |
| EX27 | EX1 | Ultrabarrier | 90/10 PIB/Clay | 400 |
| EX28 | EX2 | Ultrabarrier | 90/10 PIB/Clay | 850 |
| EX29 | EX3 | Ultrabarrier | 90/10 PIB/Clay | 500 |
| EX30 | EX4 | Ultrabarrier | 98/2 PIB/Clay | 380 |
| EX31 | EX5 | Ultrabarrier | 95/5 PIB/Clay | 390 |
| EX32 | EX6 | Ultrabarrier | 90/10 PIB/Clay | 570 |
| EX33 | EX7 | Ultrabarrier | 88/12 PIB/Clay | 590 |
| EX34 | EX9 | Ultrabarrier | 92/8 PIB/Clay | 400 |
| | | Butyl Rubber | | |
| CE12 | CE3 | Ultrabarrier | Butyl Rubber | 260 |
| EX35 | EX10 | Ultrabarrier | 90/10 BR/Clay | 420 |
| | | Lower MW PIB w/ Less Tackifier | | |
| EX36 | EX11 | Ultrabarrier | 90/10 B50/Clay | 310 |
| | | Prior Art Example | | |
| EX37 | EX12 | Ultrabarrier | 100/10 PIB/Clay | 400 |

The optical density data for a control sample (identical to CE11 except the adhesive contained some UV blocker), EX27, and EX28 are provided in FIG. 8. Both the curves of EX27 and EX28 are clearly below the curve of the unfilled adhesive control sample starting at about 150 hours. These lower curves are indicative of longer calcium lifetimes and improved barrier performance. The clay in the EX28 sample was dispersed using sonication, while the clay in EX27 was dispersed using a high shear mixer. The improved performance of EX28 compared to EX27 suggests than sonication is a preferred protocol for the preparation of clay-filled barrier adhesives.

Photographs of the arrays of calcium squares for the unfilled control sample (CE11 plus UV blocker) and EX28 are provided in FIG. 9. The calcium squares for the unfilled control have almost completely disappeared after 959 hours of 60° C./90% RH environmental exposure, the result of water vapor permeating through the barrier construction and reacting with the calcium. The calcium squares for EX28, in contrast, were largely intact even after 959 hours of 60° C./90% RH environmental exposure. These images show the superior barrier performance of an ultrabarrier film that was laminated to a substrate with a clay-filled PIB adhesive compared to an ultrabarrier film laminated with a standard PIB adhesive. This performance was not seen with a food-grade oxide barrier film construction.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. An adhesive barrier film comprising a layer of barrier adhesive composition on an ultra-barrier film having an oxygen transmission rate less than 0.005 cc/m$^2$/day at 23° C. and 90% RH and a water vapor transmission rate of less than 0.005 g/m2/day at 23° C. and 90% RH, wherein the barrier adhesive composition comprises a resin system and organically modified nanoclay, the resin system comprising:
    (a) a first polyisobutylene resin having a viscosity average molecular weight of about 300,000 to about 500,000 g/mol;
    (b) a second polyisobutylene resin having a viscosity average molecular of about 700,000 to about 900,000 g/mol; and
    (c) tackifier.

2. The adhesive barrier film of claim 1 wherein the resin system comprises about 15 to about 35 wt. % of the first polyisobutylene resin relative to the total weight of the resin system.

3. The adhesive barrier film of claim 1 wherein the resin system comprises about 40 to about 60 wt. % of the second polyisobutylene resin relative to the total weight of the resin system.

4. The adhesive barrier film of claim 1 wherein the resin system comprises about 15 to about 35 wt. % of the tackifier relative to the total weight of the resin system.

5. The adhesive barrier film of claim 1 wherein the barrier adhesive composition comprises about 2 to about 15 wt. % of the nanoclay relative to the total weight of the resin system and the nanoclay.

6. The adhesive barrier film of claim 1 wherein the tackifier is a hydrogenated petroleum resin.

7. The adhesive barrier film of claim 1 wherein the barrier adhesive composition further comprises solvent.

8. The adhesive barrier film of claim 7 wherein the barrier adhesive composition comprises about 70 to about 90 wt. % of solvent relative to the total weight of the barrier adhesive composition.

9. The adhesive barrier film of claim 7 wherein the solvent comprises heptane, toluene or a combination thereof.

10. The adhesive barrier film of claim 8 wherein the solvent comprises heptane.

11. The adhesive barrier film of claim 1 wherein the nanoclay is a bentonite clay or a montmorillonite nanoclay.

12. The adhesive barrier film of claim 1 wherein the nanoclay is about 100 to about 1000 nm in its longest dimension.

13. The adhesive barrier film of claim 1 wherein the nanoclay is modified with a quaternary ammonium ion.

14. The adhesive barrier film claim 1 wherein the barrier adhesive composition has an optical transmittance of about 90% or greater.

15. The adhesive barrier film of claim 1 wherein the barrier adhesive composition has a haze of about 3% or less.

16. An adhesive barrier film comprising a barrier adhesive composition on an ultra-barrier film having an oxygen transmission rate less than 0.005 cc/m$^2$/day at 23° C. and 90% RH and a water vapor transmission rate of less than 0.005 g/m2/day at 23° C. and 90% RH, wherein the barrier adhesive composition comprises a resin system, organically modified nanoclay, and solvent, the resin system comprising:
    (a) about 15 to about 35 wt. % of a first polyisobutylene resin having a viscosity average molecular weight of about 300,000 to about 500,000 g/mol,
    (b) about 40 to about 60 wt. % of a second polyisobutylene resin having a viscosity average molecular of about 700,000 to about 900,000 g/mol, and
    (c) about 15 to about 35 wt. % of tackifier,
    all relative to the total weight of the resin system.

17. The adhesive barrier film of claim 16 wherein the barrier adhesive composition comprises about 2 to about 15 wt. % of the nanoclay relative to the total weight of the resin system and the nanoclay.

18. The adhesive barrier film of claim 16 wherein the ultra-barrier film is a multilayer film comprising an inorganic visible light-transmissive layer disposed between polymer layers.

19. The adhesive barrier film of claim 16 wherein the ultra-barrier film is a foil.

20. The adhesive barrier film of claim 16 further comprising a substrate disposed on the gas-barrier film opposite the layer of the barrier adhesive composition.

21. The adhesive barrier film of claim 20 wherein the substrate comprises polyethylene terephthalate.

22. The adhesive barrier film of claim 16 further comprising a release layer disposed on the layer of the barrier adhesive opposite the gas-barrier film.

* * * * *